(12) United States Patent
Lamotte et al.

(10) Patent No.: US 6,887,556 B2
(45) Date of Patent: May 3, 2005

(54) MATERIAL FOR MAKING A CONDUCTIVE PATTERN

(75) Inventors: Johan Lamotte, Rotselaar (BE); Frank Louwet, Diepenbeek (BE); Tom Cloots, Londerzeel (BE); Huub Van Aert, Pulderbos (BE)

(73) Assignee: Agfa-Gevaert, Mortsel (BE)

( * ) Notice: Subject to any disclaimer, the term of this patent is extended or adjusted under 35 U.S.C. 154(b) by 169 days.

(21) Appl. No.: 10/316,274

(22) Filed: Dec. 11, 2002

(65) Prior Publication Data

US 2003/0170454 A1 Sep. 11, 2003

Related U.S. Application Data

(60) Provisional application No. 60/349,530, filed on Jan. 18, 2002.

(30) Foreign Application Priority Data

Dec. 11, 2001 (EP) .......................................... 01000739

(51) Int. Cl.$^7$ ................................................ D06N 7/04
(52) U.S. Cl. .................... 428/141; 428/195.1; 428/339; 428/500; 428/689; 528/377; 252/518.1; 534/678; 534/681
(58) Field of Search .......................... 428/141, 195.1, 428/500, 689, 339; 252/518.1; 528/377; 430/164, 188, 176, 311; 534/678, 681

(56) References Cited

U.S. PATENT DOCUMENTS 5,354,613 A   10/1994   Quintens et al.
6,444,400 B1 *  9/2002   Cloots et al. ............... 430/311

FOREIGN PATENT DOCUMENTS

| EP | 1003179 A1 | 5/2000 |
| EP | 1054414 A1 | 11/2000 |
| EP | 1079397 A1 | 2/2001 |

OTHER PUBLICATIONS

Search Report for EP 01000739 (Feb. 18, 2002).

* cited by examiner

*Primary Examiner*—Merrick Dixon
(74) *Attorney, Agent, or Firm*—Leydig, Voit & Mayer Ltd.

(57) ABSTRACT

A material for making a conductive pattern, the material comprising a support and a heat-differentiable element, the heat-differentiable element comprising an outermost layer containing a polyanion and an intrinsically conductive polymer and optionally a second layer contiguous with the outermost layer, characterized in that the outermost layer and/or the optional second layer contains hydrophobic thermocoagulable latex particles in a weight ratio range with respect to the intrinsically conductive polymer in the range of 20:1 to 1:5, the hydrophobic thermocoagulable latex particles are capable upon heating of increasing the conductivity of the heated parts of the outermost layer relative to the unheated parts of the outermost layer and/or changing the removability of the heated parts of the outermost layer relative to the unheated parts of the outermost layer and the heat-differentiable element does not comprise a di- or polyhydroxy organic compound or an aprotic compound with a dielectric constant, $\in, \geq 15$; a method of making a conductive pattern on a support therewith; and a use of the material for making a conductive pattern in making an electronic circuit in the production of an electric or semiconductor device such as a printed circuit board, an integrated circuit, a display or touch screen, an electroluminescent device or a photovoltaic cell.

13 Claims, No Drawings

MATERIAL FOR MAKING A CONDUCTIVE PATTERN

The application claims the benefit of U.S. Provisional Application No. 60/349,530 filed Jan. 18, 2002, which is incorporated by reference.

FIELD OF THE INVENTION

The present invention relates to a material and a method for making a conductive pattern.

BACKGROUND OF THE INVENTION

In the fabrication of flexible liquid crystal (LC) displays, electroluminescent devices and photovoltaic cells transparent ITO (indium-tin oxide) electrodes are used. These electrodes are made by vacuum sputtering of ITO onto a substrate. This method involves high temperatures, up to 250° C., and therefore glass substrates are generally used. The range of potential applications is limited, because of the high fabrication costs, the low flexibility (pliability) and stretchability as a consequence of the brittleness of the ITO layer and the glass substrate. Therefore the interest is growing in all-organic devices, comprising plastic resins as a substrate and organic intrinsically conductive polymer layers as electrodes. Such plastic electronics allow the realization of low cost devices with new properties (Physics World, March 1999, p.25–39). Flexible plastic substrates can be provided with an intrinsically conductive polymer layer by continuous roller coating methods (compared to batch process such as sputtering) and the resulting organic electrodes enable the fabrication of electronic devices characterised by a higher flexibility and a lower weight.

The production and the use of intrinsically conductive polymers such as polypyrrole, polyaniline, polyacetylene, polyparaphenylene, polythiophene, polyphenylenevinylene, polythienylenevinylene and polyphenylenesulphide are known in the art.

EP-A 440 957 discloses dispersions of polythiophenes, constructed from structural units of formula (I):

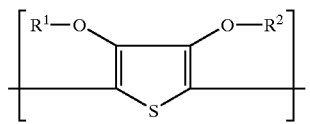

in which $R^1$ and $R^2$ independently of one another represent hydrogen or a $C_{1-4}$-alkyl group or together form an optionally substituted $C_{1-4}$-alkylene residue, in the presence of polyanions. Furthermore, EP-A-686 662 discloses mixtures of A) neutral polythiophenes with the repeating structural unit of formula (I),

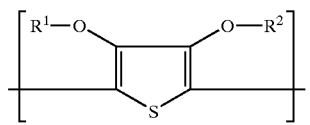

in which $R^1$ and $R^2$ independently of one another represent hydrogen or a $C_{1-4}$-alkyl group or together represent an optionally substituted $C_{1-4}$-alkylene residue, preferably an optionally with alkyl group substituted methylene, an optionally with $C_{1-12}$-alkyl or phenyl group substituted 1,2-ethylene residue or a 1,2-cyclohexene residue, and B) a di- or polyhydroxy- and/or carboxy groups or amide or lactam group containing organic compound; and conductive coatings therefrom which are tempered at elevated temperature, preferably between 100 and 250° C., during preferably 1 to 90 seconds to increase their resistance preferably to <300 ohm/square.

EP-A 1 079 397 discloses a method of making an electroconductive pattern on a support which is provided with a polymer layer containing a polythiophene, a polyanion and a di- or polyhydroxy organic compound, wherein the surface resistance (SR) of the polymer layer is reduced at selected areas from an initial value $SR_i$, which is higher than $10^4$ Ω/square, to $SR_i/\Delta$, $\Delta$ being at least 10, by heating the selected areas without substantially ablating or destroying the polymer layer.

JP 04-100867 discloses a conductive paste characterized in that it is a conductive paste material comprising conductive material, organic binder and solvent as essential components and the volumetric resistance rises through heat treatment after application and drying.

U.S. Pat. No. 5,354,613 discloses a sheet or web material comprising a hydrophobic resin support or paper support coated with at least one hydrophobic resin layer wherein said resin support or resin layer is coated with an outermost antistatic layer containing as an essential component a polythiophene with conjugated polymer backbone in the presence of a polymeric polyanion compound, wherein said antistatic layer contains also a hydrophobic organic polymer having a glass transition value (Tg) of at least 40° C., said polythiophene being present at a coverage of at least 0.001 g/m² and the weight ratio of said polythiophene to said hydrophobic organic polymer being in the range of 1/10 to 1/1000. The invention examples disclose weight ratios of polythiophene to hydrophobic polymer in the range of 1/18.5 to 1/110.8 in coated dispersions containing N-methylpyrrolidone, an aprotic compound with a dielectric constant, $\in$, $\geq 15$, and a weight ratio of polythiophene to hydrophobic polymer of 1/60.5 in dispersions not containing N-methylpyrrolidone.

EP-A 1 054 414 discloses a method for producing electrode pattern in a conductive polymer on a substrate comprising the steps of: applying a layer containing between 10 and 5000 mg/m² of a conductive polymer, so as to prepare a conductive layer, and printing an electrode pattern on said layer using a printing solution containing of an oxidant selected from the group consisting of $ClO^-$, $BrO^-$, $MnO_4^-$, $Cr_2O_7^{--}$, $S_2O_8^{--}$ and $H_2O_2$. Example 1 discloses the coating of a dispersion containing 417 mL of a PT dispersion containing 0.284% by weight of PEDOT, 50 mL of methylpyrrolidone, an aprotic compound with a dielectric constant, $\in$, $\geq 15$, 8.8 mL of a 30% by weight dispersion of co(vinylidene chloride/methyl acrylate/itaconic acid 88/10/2 and 0.5 mL of FLUORAD™ FC430 made up to 1000 mL with distilled water on a 100 μm thick poly(ethylene terephthalate) support. The weight ratio of polythiophene (PEDOT) to polymer was 1/2.15.

EP-A 1 003 179 discloses a method for producing a polymeric conductive layer on an object comprising the steps of: providing an aqueous composition containing a polythiophene, a polyanion compound and an aprotic compound with a dielectric constant, $\in$, $\geq 15$; applying said composition to said object forming a layer; and drying said layer to form a conductive polymeric layer on said object. Example 1 discloses the coating of a dispersion containing 417 mL of a PT dispersion containing 0.284% by weight of PEDOT, 50 mL of methylpyrrolidone, an aprotic compound with a dielectric constant, $\in$, $\geq 15$, 8.8 mL of a 30% by weight dispersion of co(vinylidene chloride/methyl acrylate/ itaconic acid 88/10/2 and 0.5 mL of FLUORAD™ FC430 made up to 1000 mL with distilled water on a 100 μm thick poly(ethylene terephthalate) support. The weight ratio of polythiophene (PEDOT) to polymer was 1/2.15.

Coated layers of organic intrinsically conductive polymers can be structured into patterns using known microlithography techniques. In WO-A-97 18944 a process is described wherein a positive or negative photoresist is applied on top of a coated layer of an organic intrinsically conductive polymer, and after the steps of selectively exposing the photoresist to UV light, developing the photoresist, etching the intrinsically conductive polymer layer and finally stripping the non-developed photoresist with an organic solvent, a patterned layer is obtained. A similar technique has been described in 1988 in Synthetic Metals, volume 22, pages 265–271 for the design of an all-organic thin-film transistor. Such methods are cumbersome as they involve many steps and require the use of hazardous chemicals.

ASPECTS OF THE INVENTION

It is an aspect of the present invention to provide a material containing an intrinsically conductive polymer for making a conductive pattern, without the use of hazardous chemicals.

It is a further aspect of the present invention to provide a method of making a conductive pattern, which does not require the use of hazardous chemicals.

Further aspects and advantages of the invention will become apparent from the description hereinafter.

SUMMARY OF THE INVENTION

It has been found that heating an element containing a polyanion, an intrinsically conductive polymer and thermocoagulable latex in the absence of a di- or polyhydroxy organic compound or an aprotic compound with a dielectric constant, ∈, ≧15 at a weight ratio of intrinsically conductive polymer to latex in the range 20:1 to 1:5 surprisingly results in an increase in the surface conductivity and/or a change in the removability of the heated parts of the element with respect to the removability of the unheated parts thereof.

Aspects of the present invention are realized by providing a material for making a conductive pattern, the material comprising a support and a heat-differentiable element, the heat-differentiable element comprising an outermost layer containing a polyanion and an intrinsically conductive polymer and optionally a second layer contiguous with the outermost layer, characterized in that the s outermost layer and/or the optional second layer contains hydrophobic thermocoagulable latex particles in a weight ratio range with respect to the intrinsically conductive polymer in the range of 20:1 to 1:5, the hydrophobic thermocoagulable latex particles are capable upon heating of increasing the conductivity of the heated parts of the outermost layer relative to the unheated parts of the outermost layer and/or changing the removability of the heated parts of the outermost layer relative to the unheated parts of the outermost layer and the heat-differentiable element does not comprise a di- or polyhydroxy organic compound or an aprotic compound with a dielectric constant, ∈, ≧15.

Aspects of the present invention are also realized by providing a method of making a conductive pattern on a support comprising the steps of: providing the above-mentioned material for making a conductive pattern; imagewise heating the material thereby obtaining a differentiation of the surface conductivity and/or removability with a developer of the heated and the unheated areas of the outermost layer; optionally processing the material with the developer, thereby at least partially removing areas of the outermost layer optionally together with a layer contiguous therewith; and optionally treating the material with a conductivity enhancement agent to increase the conductivity of the non-removed areas of the outermost layer.

Aspects of the present invention are also realized in the use of the above-mentioned material or the above described process in making an electronic circuit in the production of an electric or semiconductor device such as a printed circuit board, an integrated circuit, a display or touch screen, an electroluminescent device or a photovoltaic cell.

Further advantages and embodiments of the present invention will become apparent from the following description.

DETAILED DESCRIPTION OF THE INVENTION

Definitions

The term "support" means a "self-supporting material" so as to distinguish it from a "layer" which may be coated on a support, but which is itself not self-supporting. It also includes any treatment necessary for, or layer applied to aid, adhesion to the light-exposure differentiable element.

The term conductive means having a surface resistance or $10^{11}$ Ω/square or less and is a generic term including both the terms antistatic and electroconductive. The term electroconductive means having a surface resistance below $10^6$ Ω/square. Antistatic materials have surface resistances in the range from $10^6$ to $10^{11}$ Ω/square and cannot be used as an electrode.

The term conductive pattern means a pattern with elements which have different surface resistances.

The term electroconductive pattern means a pattern in the outermost layer, according to the present invention, which is electroconductive or can be made electroconductive by post-treatment.

The term intrinsically conductive polymer means organic polymers which have (poly)-conjugated π-electron systems (e.g. double bonds, aromatic or heteroaromatic rings or triple bonds) and whose conductive properties are not influenced by environmental factors such as relative humidity.

Thermocoagulable particles are hydrophobic thermoplastic polymer particles which are capable of undergoing coagulation (coalescence) upon heating. The coagulation temperature of thermoplastic polymer particles is that temperature at which the thermoplastic polymer particles are sufficiently soft to coagulate together. This temperature will be generally below the melting point of the polymer particles.

Conductivity enhancement refers to a process in which the conductivity is enhanced e.g. by contact with high boiling point liquids such as di- or polyhydroxy- and/or carboxy groups or amide or lactam group containing organic compound optionally followed by heating at elevated temperature, preferably between 100 and 250° C., during preferably 1 to 90 s, results in conductivity increase. Alternatively in the case of aprotic compounds with a dielectric constant ≧15, e.g. N-methyl-pyrrolidinone, temperatures below 100° C. can be used. Such conductivity enhancement is observed with polythiophenes and can take place during the preparation of the outermost layer or subsequently. Particularly preferred liquids for such treatment are N-methyl-pyrrolidinone and diethylene glycol such as disclosed in EP-A 686 662 and EP-A 1 003 179.

The term removability means mechanically removable in the absence of a liquid or removable with the application of a liquid with or without the simultaneous or subsequent use of rubbing or other mechanical removal means. The application of liquid can dissolve, swell or disperse the outermost layer according to the present invention such that removal is realized or enabled.

Image-wise exposed in heat mode means that the chemical changes in the material concerned are brought about by heat resulting from the absorption of light rather than directly by the absorbed light itself.

The abbreviation PEDOT represents poly(3,4-ethylenedioxythiophene).

The abbreviation PSS represents poly(styrenesulphonic acid) or poly(styrenesulphonate).

The abbreviation PVA represents poly(vinyl alcohol).

The abbreviation PAA represents polyacrylic acid.

Conductive

The term "conductive" is related to the electric resistance of the material. The electric resistance of a layer is generally expressed in terms of surface resistance $R_s$ (unit $\Omega$; often specified as $\Omega$/square). Alternatively, the conductivity may be expressed in terms of volume resistivity $R_v = R_s \cdot d$, wherein d is the thickness of the layer, volume conductivity $k_v = 1/R_v$ [unit: S(iemens)/cm] or surface conductance $k_s = 1/R_s$ [unit: S(iemens).square].

All values of electric resistance presented herein are measured according to one of the following methods. In the first method the support coated with the conductive outermost layer is cut to obtain a strip having a length of 27.5 cm and a width of 35 mm and strip electrodes are applied over its width at a distance of 10 cm perpendicular to the edge of the strip. The electrodes are made of an intrinsically conductive polymer, ECCOCOAT CC-2 available from Emerson & Cumming Speciality polymers. Over the electrode a constant potential is applied and the current flowing through the circuit is measured on a pico-amperometer KEITHLEY 485. From the potential and the current, taking into account the geometry of the area between the electrodes, the surface resistance in $\Omega$/square is calculated.

In the second method, the surface resistance was measured by contacting the outermost layer with parallel copper electrodes each 35 mm long and 35 mm apart capable of forming line contacts, the electrodes being separated by a Teflon™ insulator. This enables a direct measurement of the surface resistance.

In the third method resistance measurements were carried out with a Fluke™ multimeter (maximum reading $4.0 \times 10^7$ $\Omega$) with two point electrodes 1 cm apart on the material being measured.

Material for Making a Conductive Pattern

Aspects of the present invention are realized by providing a material for making a conductive pattern, the material comprising a support and a heat-differentiable element, the heat-differentiable element comprising an outermost layer containing a polyanion and an intrinsically conductive polymer and optionally a second layer contiguous with the outermost layer, characterized in that the outermost layer and/or the optional second layer contains hydrophobic thermocoagulable latex particles in a weight ratio range with respect to the intrinsically conductive polymer in the range of 20:1 to 1:5, the hydrophobic thermocoagulable latex particles are capable upon heating of increasing the conductivity of the heated parts of the outermost layer relative to the unheated parts of the outermost layer and/or changing the removability of the heated parts of the outermost layer relative to the unheated parts of the outermost layer and the heat-differentiable element does not comprise a di- or polyhydroxy organic compound or an aprotic compound with a dielectric constant, $\in$, $\geq 15$.

According to a first embodiment of the material for making a conductive pattern, according to the present invention, the conductive pattern is an electroconductive pattern.

According to a second embodiment of the material for making a conductive pattern, according to the present invention, the material further comprises at least one additional layer.

Support

According to a third embodiment of the material for making a conductive pattern, according to the present invention, the support is selected from the group consisting of polymeric films, silicon, ceramics, oxides, glass, glass-reinforced polymeric film, glass/plastic laminates, metal/plastic laminates, paper and laminated paper.

The support may be pretreated, e.g. with a corona or glow discharge, or provided with a subbing layer or other adhesion promoting means to aid adhesion to the heat-differentiable element. Suitable polymeric films are poly(ethylene terephthalate), poly-(ethylene naphthalate), polystyrene, polyethersulphone, polycarbonate, polyacrylate, polyamide, polyimides, cellulosetriacetate, polyolefins and polyvinylchloride.

According to a fourth embodiment of the material for making a conductive pattern, according to the present invention, the support is transparent.

Heat-differentiable Element

A heat-differentiable element, as used in the material of the present invention, has an outermost layer containing a polyanion and an intrinsically conductive polymer, and optionally has a second layer contiguous with the outermost layer, wherein the outermost layer and/or the optional second layer contains hydrophobic thermocoagulable latex particles and does not contain a di- or polyhydroxy organic compound or an aprotic compound with a dielectric constant, $\in$, $\geq 15$. This heat-differentiation is exhibited as an increase in the conductivity of the heated parts of the outermost layer relative to the unheated parts of the outermost layer and/or changes in the removability of the heated parts of the outermost layer relative to the unheated parts of the outermost layer.

According to a fifth embodiment of the material for making a conductive pattern, according to the present invention, the heat-differentiable element consists of a single layer.

According to a sixth embodiment of the material for making a conductive pattern, according to the present, the heat-differentiable element consists of two or more layers.

According to a seventh embodiment of the material for making a conductive pattern, according to the present invention, the heat-differentiable element contains a weight ratio of hydrophobic thermocoagulable latex particles to intrinsically conductive polymer in the range of 5:1 to 1:2.

According to an eighth embodiment of the material for making a conductive pattern, according to the present invention, the heat-differentiable element contains a weight ratio of hydrophobic thermocoagulable latex particles to the intrinsically conductive polymer in the range of 9:1 to 1:3.

According to a ninth embodiment of the material for making a conductive pattern, according to the present invention, the heat-differentiable element contains a weight ratio of hydrophobic thermocoagulable latex particles to the intrinsically conductive polymer is in the range of 9:1 to 1:2.

According to a tenth embodiment of the material for making a conductive pattern, according to the present invention, the heat-differentiable element has a surface resistance lower than $10^6$ $\Omega$/square.

According to an eleventh embodiment of the material for making a conductive pattern, according to the present invention, the heat-differentiable element has a surface resistance capable of being lower than $10^6$ $\Omega$/square after treatment in a so-called conductivity enhancement process.

Intrinsically Conductive Polymer

The intrinsically conductive polymers used in the present invention can be any intrinsically conductive polymer known in the art e.g. polyacetylene, polypyrrole, polyaniline, polythiophene, etc. Details about suitable intrinsically conductive polymers can be found in "Advances in Synthetic Metals", ed. P. Bernier, S. Lefrant, and G. Bidan, Elsevier, 1999; "Intrinsically Conducting Polymers: An Emerging Technology", Kluwer (1993); "Conducting Polymer Fundamentals and Applications, A Practical Approach", P. Chandrasekhar, Kluwer, 1999; and "Handbook of Organic Conducting Molecules and Polymers", Ed. Walwa, Vol. 1–4, Marcel Dekker Inc. (1997).

According to a twelfth embodiment of the material for making a conductive pattern, according to the present invention, the intrinsically conductive polymer is a polymer or copolymer of a substituted or unsubstituted thiophene.

According to a thirteenth embodiment of the material for making a conductive pattern, according to the present invention, the intrinsically conductive polymer is a substituted or unsubstituted thiophene corresponding to formula (II):

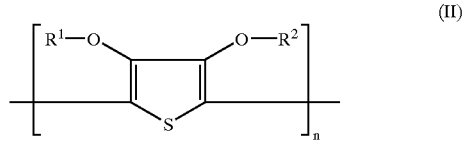

in which n is larger than 1 and each of $R^1$ and $R^2$ independently represents hydrogen or an optionally substituted $C_{1-4}$ alkyl group or together represent an optionally substituted $C_{1-5}$-alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

The preparation of such a polythiophene and of aqueous dispersions containing such a polythiophene and a polyanion is described in EP-A-440 957 and corresponding U.S. Pat. No. 5,300,575. Basically the preparation of polythiophene proceeds in the presence of polymeric polyanion compounds by oxidative polymerisation of 3,4-dialkoxythiophenes or 3,4-alkylenedioxythiophenes according to the following formula:

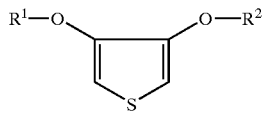

wherein $R^1$ and $R^2$ are as defined above.

Stable aqueous polythiophene dispersions having a solids content of 0.05 to 55% by weight and preferably of 0.1 to 10% by weight can be obtained by dissolving thiophenes corresponding to the formula above, a polyacid and an oxidising agent in an organic solvent or preferably in water, optionally containing a certain amount of organic solvent, and then stirring the resulting solution or emulsion at 0° C. to 100° C. until the polymerisation reaction is completed. The polythiophenes formed by the oxidative polymerisation are positively charged, the location and number of such positive charges not being determinable with certainty and therefore not mentioned in the general formula of the repeating units of the polythiophene polymer.

The oxidising agents are those which are typically used for the oxidative polymerisation of pyrrole as described in for example J. Am. Soc. 85, 454 (1963). Preferred inexpensive and easy-to-handle oxidising agents are iron(III) salts, e.g. $FeCl_3$, $Fe(ClO_4)_3$ and the iron(III) salts of organic acids and inorganic acids containing organic residues. Other suitable oxidising agents are $H_2O_2$, $K_2Cr_2O_7$, alkali or ammonium persulphates, alkali perborates, potassium permanganate and copper salts such as copper tetrafluoroborate. Air or oxygen can also be used as oxidising agents. Theoretically, 2.25 equivalents of oxidising agent per mol of thiophene are required for the oxidative polymerisation thereof (J. Polym. Sci. Part A, Polymer Chemistry, Vol. 26, p.1287, 1988). In practice, however, the oxidising agent is used in excess, for example, in excess of 0.1 to 2 equivalents per mol of thiophene.

Polyanion

According to a fourteenth embodiment of the material for making a conductive pattern, according to the present invention, the polyanion is formed from a polyacid or it can be added as a salt of the corresponding polyacid, e.g. an alkali salt. Preferred polyacids or salts thereof are polymeric carboxylic acids such as poly(acrylic acid), poly((meth) acrylic acid) and poly(maleic acid) or polymeric sulphonic acids such as poly(styrene sulphonic acid) or poly(vinyl sulphonic acid). Alternatively, copolymers of such carboxylic and/or sulphonic acids and of other polymerizable monomers such as styrene or acrylates can be used.

According to a fifteenth embodiment of the material for making a conductive pattern, according to the present invention, the polyanion is poly(styrene sulphonate).

The molecular weight of these polyanion forming polyacids is preferably between 1000 and $2\times10^6$, more preferably between 2000 and $5\times10^5$. These polyacids or their alkali salts are commercially available and can be prepared according to the known methods, e.g. as described in Houben-Weyl, Methoden der Organische Chemie, Bd. E20 Makromolekulare Stoffe, Teil 2, (1987), pp. 1141.

Thermocoagulable Latex Particles

The thermocoagulable latex particles used in connection with the present invention preferably have a coagulation temperature between 35° C. and 10° C. below the decomposition temperature of the polymer and more preferably between 50° C. and 10° C. below the decomposition temperature of the polymer. Coagulation results from softening or melting of the thermoplastic polymer particles under the influence of heat.

For practical purposes thermoplastic polymer particles are preferred with a coagulation temperature between 10 and 200° C. above room temperature. When the thermoplastic polymer particles used according to the present invention are subjected to a temperature above their coagulation temperature they coagulate to form a hydrophobic agglomerate.

Specific examples of hydrophobic polymer particles for use in connection with the present invention are e.g. polyethylene, polypropylene and polyvinylene chloride with melting points of 110, 150 and 190° C. respectively, and the following polymers: polystyrene, poly[methyl (meth)acrylate], poly[ethyl (meth)acrylate], polyvinyl chloride, polyacrylonitrile etc. or copolymers thereof. The glass transition temperature of many polymers is about two-thirds that of the crystalline melting point when measured in K. An important exception to this occurs with copolymers. Polymers with a large range of coagulation temperatures can be obtained by copolymerization, copolycondensation, variation in molecular weight or plasticization. The weight average molecular weight of the polymers may range from 5,000 to 1,000,000.

The hydrophobic thermoplastic particles may have a particle size from 0.01 µm to 50 µm, more preferably between 0.05 µm and 10 µm and most preferably between 0.05 µm and 2 µm.

The polymer particles are present as a dispersion in the aqueous coating liquid of the heat-differentiable element and may be prepared by the methods disclosed in U.S. Pat. No. 3,476,937, which is hereby incorporated by reference. Another method especially suitable for preparing an aqueous dispersion of the thermoplastic polymer particles comprises: dissolving the hydrophobic thermoplastic polymer in an organic water immiscible solvent, dispersing the thus obtained solution in water or in an aqueous medium and removing the organic solvent by evaporation.

According to a sixteenth embodiment of the material for making a conductive pattern, according to the present invention, the heat-differentiable element contains between 20% by weight and 65% by weight of the hydrophobic thermocoagulable latex particles.

According to a seventeenth embodiment of the material for making a conductive pattern, according to the present invention, the heat-differentiable element contains between 25% by weight and 55% by weight of the hydrophobic thermocoagulable latex particles.

According to an eighteenth embodiment of the material for making a conductive pattern, according to the present invention, the heat-differentiable element contains between 30% by weight and 45% by weight of the hydrophobic thermocoagulable latex particles.

Surfactants may be used to aid the dispersion of the hydrophobic thermoplastic particles in the dispersion medium.

Suitable thermocoagulable polymer latexes for use in the present invention are:

|  | Particle size [nm] | % by wt. conc. in water |
|---|---|---|
| LATEX01 polystyrene latex |  | 21 |
| LATEX02 polystyrene latex | 68 | 21 |
| LATEX03 poly(methyl methacrylate) latex | 68 | 21 |
| LATEX04 poly(methyl methacrylate) latex | 54 | 20 |
| LATEX05 poly(methyl methacrylate) latex | 52 | 20.3 |
| LATEX06 poly(methyl methacrylate) latex | 49 | 20.65 |
| LATEX07 poly(methyl methacrylate) latex | 64 | 20.65 |

Compounds Capable of Converting Absorbed Light into Heat

According to a nineteenth embodiment of the material for making a conductive pattern, according to the present invention, the heat-differentiable element further contains a compound capable of converting absorbed light into heat, which may be present in the outermost layer of the heat-differentiable element or in a second layer of the heat-differentiable element contiguous therewith.

Suitable compounds capable of converting light into heat are infrared absorbing components although the wavelength of absorption is not of particular importance as long as the absorption of the compound used is in the wavelength range of the light source used for image-wise exposure. Particularly useful compounds are, for example, dyes, particularly infrared dyes, carbon black, metal carbides, borides, nitrides, carbonitrides and oxides. Suitable infrared dyes are benzpyrilium, squarilium and croconylium dyes as disclosed in U.S. Pat. No. 5,627,014 herein incorporated by reference. The polythiophene itself absorbs infrared light, so it may not be necessary to add dyes or pigments when an infrared light source is used. The addition of a dye or pigment capable of absorbing visible light should be avoided when the method of the present invention is to be used for making a transparent electrode. Alternatively, the support may absorb the incident light, e.g. when exposing a plastic support such as poly(ethylene terephthalate), to an excimer laser.

Suitable IR-absorbing compounds capable of converting absorbed light into heat are:

λmax [nm]

IR01    830

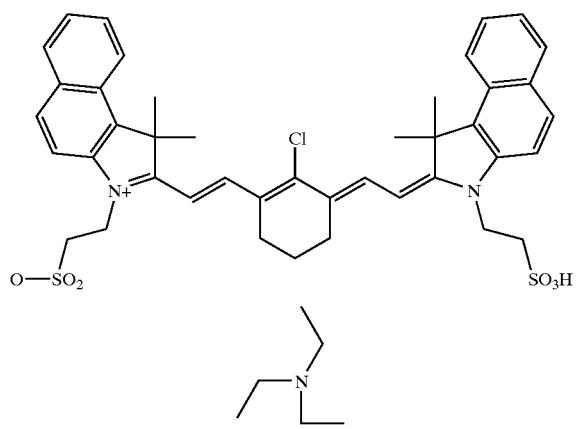

-continued
| | λmax [nm] |
|---|---|
| IR02 | 1053 |
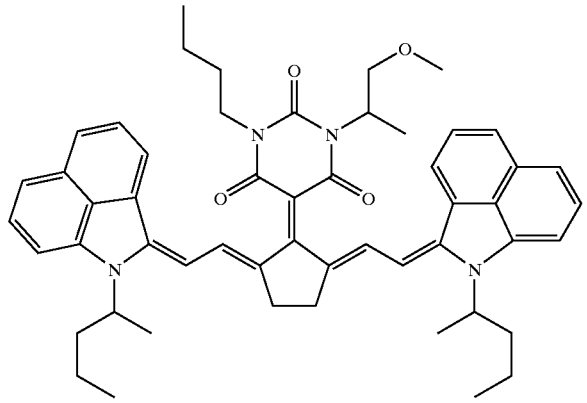
| IR03 | 833 |
|---|---|
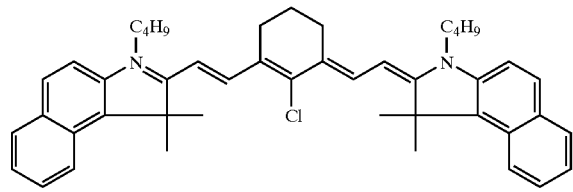
| IR04 | 1064 |
|---|---|
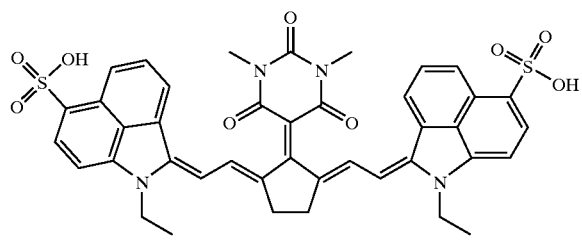
IR05
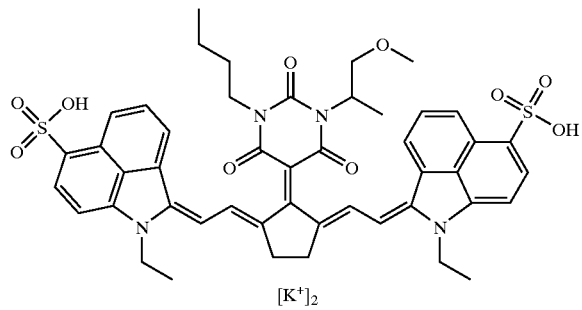

-continued $\lambda$max [nm]

IR06

[Chemical structure of IR06 dye with $[K^+]_4$ counterions]

IR04, IR05 and IR06 all have sufficiently broad IR-absorption peaks to enable both laser diodes e.g. emitting at 830 nm and Nd-YAG lasers emitting at 1064 nm to be used as can be seen from the absorption of layers of latex with 500 mg/m² of latex and different coverages of dyes IR04, IR05 and IR06 given in Table 1 below.

TABLE 1

| IR-absorber | coverage [mg/m²] | % absorption at 830 nm | % absorption at 1064 nm |
|---|---|---|---|
| IR04 | 40 | 24 | 32 |
| IR04 | 80 | 36 | 45 |
| IR05 | 40 | 18 | 29 |
| IR05 | 80 | 27 | 42 |
| IR06 | 40 | 19 | 28 |
| IR06 | 80 | 28 | 38 |

Additional Ingredients

The heat-differentiable element and any layers of the material, according to the present invention, may contain various additional ingredients, such as one or more surfactants, spacing particles, levelling agents and other conventional additives.

According to a twentieth embodiment of the material for making a conductive pattern, according to the present invention, the heat-differentiable element further contains a surfactant.

According to a twenty-first embodiment of the material for making a conductive pattern, according to the present invention, the heat-differentiable element further contains an anionic or non-ionic surfactant. Suitable surfactants include:

| MERSOLAT ™H76 | = a sodium pentadecylsulfonate, supplied as a 76% concentrate by BAYER; |
|---|---|
| ULTRAVON ™ W | = a sodium arylsulfonate from, supplied as a 75–85% concentrate by CIBA; |
| FT 248 | = $C_8F_{17}SO_3$ $(C_2H_5)_4N^+$, an anionic surfactant; |
| ZONYL ™ FSN100 | = an ethoxylated non-ionic fluoro-surfactant with the structure: $F(CF_2CF_2)_yCH_2CH_2O(CH_2CH_2O)_xH$ from DuPont; |

-continued

| ZONYL ™ FSO100 | = an ethoxylated non-ionic fluoro-surfactant with the structure: $F(CF_2CF_2)_yCH_2CH_2O(CH_2CH_2O)_xH$, where x = 0 to ca. 15 and y = 1 to ca. 7, from DuPont. |
|---|---|

Binders

According to an twenty-second embodiment of the material for making a conductive pattern, according to the present invention, the heat-differentiable element and other layers of the material, contain a binder.

Suitable binders for use in the material of the present invention are described in EP-A 564 911 and include water-soluble polymers, such as poly(vinyl alcohol), water-soluble homo- and co-polymers of acrylic acid and homo- and co-polymers of methacrylic acid. Preferred binders include poly(vinyl alcohol) and homo- and co-polymers of hydroxyethyl methacrylate and copolymers of 2-propenoic acid 2-phosphonooxy)ethyl ester, copolymers of 2-methyl-2-propenoic acid 2-phosphonooxy)ethyl ester and a vinylidene chloride, methyl methacrylate, itaconic acid (88/10/2) terpolymer. Such binders may be treated with a hardening agent, e.g. an epoxysilane such as 3-glycidyloxypropyltrimethoxysilane as described in EP-A 564 911, which is especially suitable when coating on a glass substrate.

Production Process for Materials of Present Invention

In the production of the materials of the present invention, the coating dispersions or solutions may be applied by any means known in the art: they can be spin-coated, sprayed or coated by any of the continuous coating techniques that are used to coat solutions on continuous webs, e.g. dip coating, rod coating, blade coating, air knife coating, gravure coating, reverse roll coating, extrusion coating, slide coating and curtain coating. An overview of these coating techniques can be found in the book "Modern Coating and Drying Technology", Edward Cohen and Edgar B. Gutoff Editors, VCH publishers, Inc, New York, N.Y., 1992. It is also possible to coat simultaneously multiple layers by coatings technique such as slide coating and curtain coating. It is also possible to apply the coating solutions and dispersions by printing techniques, e.g., ink-jet printing, gravure printing, flexo printing, or offset printing.

The coating solution or dispersion containing the intrinsically conductive polymer is preferably applied to the substrate in such an amount that the coated polymer layer contains between 10 and 5000 mg of intrinsically conductive polymer per $m^2$, more preferably between 100 and 500 mg of intrinsically conductive polymer per $m^2$.

Method of Making a Conductive Pattern

Aspects of the present invention are realized by providing a method of making a conductive pattern on a support comprising the steps of: providing a material for making a conductive pattern, according to the present invention; image-wise heating the material thereby obtaining a differentiation of the surface conductivity and/or removability with a developer of the heated and the unheated areas of the outermost layer; optionally processing the material with the developer, thereby at least partially removing areas of the outermost layer optionally together with a layer contiguous therewith; and optionally treating the material with a conductivity enhancement agent to increase the conductivity of the non-removed areas of the outermost layer.

According to a first embodiment of the method of making a conductive pattern, according to the present invention, the image-wise heating is carried out with a thermal head or a laser. Other devices can also be used, e.g. a heated stamp. The power applied to the polymer layer during image-wise heating should be sufficiently high to decrease the surface resistance value [SR] of the polymer layer so as to obtain conductive areas, but should not exceed a threshold value above which ablation or chemical processes are capable of substantially destroying the polymer layer.

According to a second embodiment of the method of making a conductive pattern, according to the present invention, the image-wise heating is carried out with an infrared laser. Typically infrared lasers emitting near infrared light having a wavelength in the range from ca. 700 to ca. 1500 nm are semiconductor laser diodes, a Nd:YAG or a Nd:YLF laser. The required laser power depends on the pixel dwell time of the laser beam, which is dependent on the scan speed (e.g. between 0.1 and 20 m/s, preferably between 0.5 and 5 m/s) and the spot diameter of the laser beam (defined at $1/e^2$ of maximum intensity e.g. between 1 and 100 µm, preferably between 10 and 25 µm).

A typical thermal head for use in the method of the present invention contains a plurality of adjacent, microscopic heat-resistor elements, which convert electrical energy via the Joule effect into heat. Such thermal printing heads may be used in contact or, more preferred, close proximity with the polymer layer so as to transfer efficiently the heat to the polymer layer. The operating temperature of common thermal printheads is in the range of 300 to 400° C. and the heating time per element may be less than 20 ms or even less than 1.0 ms, the pressure contact of the thermal printhead with the recording material to ensure a good transfer of heat being e.g. 200–1000 g/linear cm i.e. with a contact zone (nip) of 200 to 300 µm a pressure of 5000 to 50,000 $g/cm^2$.

According to a third embodiment of the method of making a conductive pattern, according to the present invention, the conductive pattern has a surface resistance lower than $10^6$ Ω/square.

According to a fourth embodiment of the method of making a conductive pattern, according to the present invention, the material is developed in a developer.

According to a fifth embodiment of the method of making a conductive pattern, according to the present invention, the material is developed in a water-based developer or deionized water. Suitable aqueous developers are deionized water, AZ303 (Clariant) or EN232 (AGFA-GEVAERT N.V.). When a subbing layer (also called a substrate layer) is present on the support the material is preferably rubbed thoroughly with a tissue during development to avoid residual conductivity. The rubbing can be done in the processing fluid or in a separate water bath after the development stage. Similar results can be obtained by applying a high pressure water jet after the development stage, thereby avoiding contact with the conductive areas. Alternatively, if conductivity enhancement is necessary, the developer can contain the conductivity enhancement agent as defined above, thereby combining the steps of development and contact with the conductivity enhancement agent followed by a heating step.

Suitable conductivity enhancement agents are linear, branched or cyclic aliphatic $C_{2-20}$-hydrocarbons or optionally substituted aromatic $C_{6-14}$-hydrocarbons or pyrans or furans comprising at least two hydroxy groups or at least one —COX or —CONYZ group wherein X denotes —OH and Y and Z independently of one another represent H or alkyl; or a heterocyclic compound containing at least one lactam group. Alternatively aprotic compounds with a dielectric constant, $\in$, $\geq 15$ can be used. Examples of such organic compounds are sugar or sugar derivatives such as arabinose, saccharose, glucose, fructose and lactose, or di- or polyalcohols such as sorbitol (glucitol), xylitol, mannitol, mannose, galactose, sorbose, gluconic acid, ethylene glycol, di- or tri(ethylene glycol), 1,1,1-trimethylol-propane, 1,3-propanediol, 1,5-pentanediol, 1,2,3-propantriol, 1,2,4-butantriol, 1,2,6-hexantriol, aromatic di- or polyalcohols such as resorcinol, N-methyl-2-pyrrolidinone, 2-pyrrolidinone, 1,3-dimethyl-2-imidazolidone, N,N,N',N'-tetramethylurea, formamide, dimethylformamide, and N,N-dimethylacetamide.

Industrial Application

The material for making a conductive pattern, according to the present invention, can be used for producing conductive patterns or the method of making a conductive pattern, according to the present invention, can produce a conductive pattern can be used as an electronic circuit for making an electric or semiconductor device such as a printed circuit board, an integrated circuit, a display, an electroluminescent device or a photovoltaic cell. The patterned electrode obtained by the method of the present invention can also be used for screening electromagnetic radiation or earthing electric charges, for making touch screens, radio frequency identification tags, electrochromic windows and in imaging systems, e.g. silver halide photography or electrophotography. A device such as the electronic book described in WO 97/04398 may also particularly benefit from the flexible electrode of the present invention. Even more applications are described in WO 97/18944.

While the present invention will hereinafter be described in connection with preferred embodiments thereof, it will be understood that it is not intended to limit the invention to those embodiments. All percentages given in the EXAMPLES are percentages by weight unless otherwise stated.

Further ingredients used in the heat-differentiable element:

| | | |
|---|---|---|
| PEDOT | = | poly(3,4-ethylenedioxythiophene) |
| PSS | = | poly(styrenesulphonic acid) or poly (styrenesulphonate) |
| PVA | = | poly(vinyl alcohol) |
| PAA | = | polyacrylic acid |
| KELZAN ™S | = | a xanthan gum from MERCK & CO., Kelco Division, USA, which according to Technical Bulletin DB-19 is a polysaccharide containing mannose, glucose and glucuronic repeating units as a mixed potassium, sodium and calcium salt; |
| PE40 | = | PERAPRET ™ PE40, a 40% aqueous dispersion of polyethylene latex from BASF; |
| POLYMER01 | = | a 26.8% aqueous latex of a copolymer of 88% vinylidene chloride, 10% methyl acrylate and 2% itaconic acid and containing 0.13% Mersolat H; |
| POLYMER02 | = | a 20% aqueous poly(methyl methacrylate) latex with 100 nm particles; |
| PEDOT/PSS-1 | = | a 1.2% aqueous dispersion of poly(3,4-ethylene-oxythiophene)/poly(styrene sulphonic acid) (1:2.46 by weight) produced as described in U.S. Pat. No. 5,354,613; |
| Kieselsol 100F | = | a 30% aqueous dispersion of colloidal silica from BAYER; |
| UVONAC | = | a 10% aqueous solution of acetylated ULTRAVON W; |
| MESOLAT ™ H | = | a 76% aqueous paste of a sodium pentadecyl-sulfonate from BAYER; |
| MAT01 | = | a 20% aqueous dispersion of 6 μm crosslinked beads of a copolymer of 98% methyl methacrylate and 2% stearyl methacrylate and 0.4% Arkopal NO 60 produced as described in U.S. Pat. No. 4,861,812; |

SUPPORTS USED IN THE EXAMPLES

Support 01: 100 μm polyethylene terephthalate (PET) film was coated with an aqueous ethanol dispersion containing the following ingredients to produce the following ingredient coverages:

| Composition | | | |
|---|---|---|---|
| POLYMER01 | = | 79.1 mg/m² | (79.1% by weight) |
| Kieselsol ® 100F | = | 18.6 mg/m² | (18.6% by weight) |
| MERSOLAT ® H | = | 0.4 mg/m² | (0.5% by weight) |
| ULTRAVON ® W | = | 1.9 mg/m² | (1.9% by weight) |

Support 02: 175 μm thick polyethylene terephthalate support was coated with an aqueous ethanol dispersion containing the following ingredients to produce the following ingredient coverages:

| Composition | | | |
|---|---|---|---|
| POLYMER01 | = | 162.2 mg/m² | (78.4% by weight) |
| Kieselsol ® 100F | = | 40.0 mg/m² | (19.3% by weight) |
| MERSOLAT ® H | = | 0.85 mg/m² | (0.4% by weight) |
| UVONAC | = | 4.0 mg/m² | (1.9% by weight) |

Aqueous Dispersion of PEDOT/PSS

The aqueous dispersion of PEDOT/PSS in a weight ratio of 1:2.4 used in the EXAMPLES was prepared as follows: into 3000 ml of an aqueous solution of 31.5 g of PSS (171 mmol of $SO_3H$ groups) with number-average molecular weight (Mn) 40000, were introduced 25.7 g of sodium peroxodisulfate ($Na_2S_2O_8$), 0.225 g of $Fe_2(SO_4)_3.9H_2O$ and 12.78 g (90 mmol) of 3,4-ethylenedioxythiophene (EDOT). The thus obtained reaction mixture was stirred vigorously for 7 hours at 30° C. After adding again 4.3 g of sodium peroxodisulfate ($Na_2S_2O_8$) the mixture was vigorously stirred for 14 hours at 30° C. The reaction mixture was stirred twice for 2 hours at room temperature in the presence of a granulated weak basic ion exchange resin LEWATIT™ H600 and strongly acidic ion exchanger LEWATIT™ S100 from Bayer AG. The ion exchange resins were then filtered off and, finally, the mixture was post-heated at 95° C. for 2 hours. The resulting dark blue dispersion had a solid content of 1.15% by weight. The particle size of the PEDOT/PSS latex was determined by CPS disc centrifuge measurements to be narrow with a maximum at 25 nm with an average particle size of 30–50 nm.

EXAMPLE 1

In the material for making a conductive pattern of Samples I to IV, the heat-differentiable element consisted of PEDOT/PSS, LATEX01 (a polystyrene latex) and FT 248 and optionally IR01 (a compound capable of converting absorbed infrared-light into heat). Samples I to IV were produced by coating 40 mL/m² of the dispersions given in Table 2 on support nr. 01 to a wet thickness of 40 μm to produce heat-differentiable elements with the compositions given in Table 2 after drying.

TABLE 2 composition of the coating dispersions

| INGREDIENT [g] | SAM-PLE I | SAM-PLE II | SAM-PLE III | SAM-PLE IV |
|---|---|---|---|---|
| Support nr. | 01 | 01 | 01 | 01 |
| 1.2% aq. PEDOT/PSS dispersion | 417 | 417 | 417 | 417 |
| LATEX01 | 119 | 119 | 60 | 30 |
| 1% aqueous IR01 solution | — | 200 | 200 | 200 |
| 5% by wt. aq. sol. of FT 248 | 5 | 5 | 5 | 5 |
| deionized water | 459 | 259 | 318 | 348 |
| PEDOT/PSS [mg/m²] | 200 | 200 | 200 | 200 |
| LATEX01 [mg/m²] | 1000 | 1000 | 500 | 250 |
| IR01 [mg/m²] | — | 80 | 80 | 80 |
| FT 248 [mg/m²] | 10 | 10 | 10 | 10 |
| LATEX01/PEDOT weight ratio | 17.32 | 17.32 | 8.66 | 4.33 |

Heating in a Drying Cupboard

The materials of Samples I, II, III and IV were heated in a drying cupboard at different temperatures for different times as given in Table 3. Resistance measurements were then carried out with a Fluke™ multimeter with two point electrodes 1 cm apart on exposed and non-exposed areas. The results are also given in Table 3.

TABLE 3

| SAMPLE | Resistance in MΩ | | | |
|---|---|---|---|---|
| | I | II | III | IV |
| before heating | 2.4 | 3.0 | 2.7 | 1.9 |
| after 10 min at 100° C. | 2.5 | 3.5 | 3.6 | 2.5 |
| after 20 min at 100° C. | 2.3 | 3.5 | 3.6 | 2.5 |
| after 10 min at 150° C. | 1.9 | 3.5 | 4.0 | 2.5 |
| after 20 min at 150° C. | 1.8 | 3.5 | 4.0 | 2.5 |
| discoloration after heating? | none | slight | slight | slight |

These experiments show that no increase in conductivity was observed upon heating in a drying cupboard.

Exposure with a Nd-YAG Laser

The material of Sample I was then image-wise exposed in heat-mode with a NdYAG laser (1064 nm) with a spot size of 18 $\mu$m, a pitch of 10 $\mu$m, at a scan speed of 1, 2 and 4 m/s and the image plane powers given in Table 4. Resistance measurements were then carried out with a Fluke™ multimeter with two point electrodes 1 cm apart on exposed and non-exposed areas. The results are given in Table 4.

TABLE 4

| POWER [mW] | resistance [MΩ] of SAMPLE I | | |
|---|---|---|---|
| | 1 m/s | 2 m/s | 4 m/s |
| non-printed | 3.0 | 3.0 | 3.0 |
| 100 | 0.12 | 2.3 | 1.8 |
| 150 | 0.08 | 0.38 | 1.5 |
| 200 | 1.8 | 0.075 | 0.7 |
| 250 | 1.8 | 0.057 | 0.21 |
| 300 | 3.0 | 0.15 | 0.1 |
| 350 | 6.0 | 0.1 | 0.05 |
| 400 | 6.0 | 0.2 | 0.03 |
| 450 | 1.0 | 0.22 | 0.025 |
| Maximum resistance ratio of non-exposed/exposed material | 37.5 | 52.6 | 92 |

Processing of all the exposed Samples by softly rubbing with a tissue under water, with the intention of removing the non-exposed parts of the outermost layer, had an influence on the resistances determined with a Fluke™ multimeter with two point electrodes 1 cm apart on exposed and non-exposed areas. Scan lines ca. 18 $\mu$m wide were distinguishable. The results are given in Table 5. Resistance ratios of unexposed to exposed areas between $1.9 \times 10^5$ and $8.3 \times 10^5$ were obtained.

TABLE 5

| POWER [mW] | resistance [MΩ] of SAMPLE I | | |
|---|---|---|---|
| | 1 m/s | 2 m/s | 4 m/s |
| non-printed | 50000 | 50000 | 50000 |
| 100 | 0.35 | 3.2 | 50000 |
| 150 | 0.26 | 1.0 | 20000 |
| 200 | 2.0 | 0.25 | 1.5 |
| 250 | 3.4 | 0.13 | 0.45 |
| 300 | 15 | 0.27 | 0.18 |
| 350 | 6.0 | 0.5 | 0.075 |
| 400 | 10 | 0.5 | 0.06 |
| 450 | 16 | 0.8 | 0.068 |

TABLE 5-continued

| POWER [mW] | resistance [MΩ] of SAMPLE I | | |
|---|---|---|---|
| | 1 m/s | 2 m/s | 4 m/s |
| Maximum resistance ratio of non-exposed/exposed material | $1.9 \times 10^5$ | $3.85 \times 10^5$ | $8.3 \times 10^5$ |

For Sample I exposed at scanning speeds of 1, 2 and 4 m/s gently attaching an adhesive tape to the exposed materials and then peeling off the tape, with the intention of removing the non-exposed parts of the outermost layer with the tape, had an stance measurements carried out with a Fluke™ multimeter with two point electrodes 1 cm apart on exposed and non-exposed areas. The results are given in Table 6 for different laser powers and a scanning speeds of 1, 2 and 4 m/s.

TABLE 6

| POWER [mW] | resistance [MΩ] of SAMPLE I | | |
|---|---|---|---|
| | 1 m/s | 2 m/s | 4 m/s |
| non-printed | 100 | 100 | 100 |
| 100 | 0.4 | 50 | 150 |
| 150 | 0.17 | 0.36 | 40 |
| 200 | 1.5 | 0.065 | 2.0 |
| 250 | 1.0 | 0.043 | 0.2 |
| 300 | 2.3 | 0.1 | 0.1 |
| 350 | 1.5 | 0.1 | 0.055 |
| 400 | 2.0 | 0.1 | 0.028 |
| 450 | 5.0 | 0.1 | 0.022 |
| Maximum resistance ratio of non-exposed/exposed material | 588.2 | 2326 | 4545 |

The results in Table 6 show that the resistance ratio was also increased by delaminating with tape.

Exposure with a Laser Diode (830 nm)

The materials of SAMPLE I to IV were then image-wise exposed in heat-mode with a diode laser (830 nm) with a spot size of 11 $\mu$m, a pitch of 6 $\mu$m, at scan speeds of 1, 2 and 4 m/s and the image plane power given in Table 7. Both lines and areas were exposed. Resistance measurements were then carried out with a Fluke™ multimeter with two point electrodes 1 cm apart on exposed and non-exposed areas. The results are given in Table 7 for different laser powers and all scanning speeds.

For Samples II, III and IV the resistance decreased with increasing power until a minimum resistance was attained. The power for which this minimum resistance was attained increased with increasing scanning speed, which was consistent with the reduction in exposure with increasing scanning speed. Minimum resistances between $10^3$ and $10^4$ Ω were only observed for Sample III for scanning speeds of 1 and 4 m/s and for Sample IV for all scanning speeds. From this it can be concluded that the weight ratio of LATEX01 to PEDOT should not be greater than approximately 8.66 to attain such minimum resistances even in the presence of an infra-red absorbing compound, IR01, capable of converting light into heat.

Resistance ratios of unexposed to exposed areas of the outermost PEDOT/PSS-containing layer up to 1100 were attained.

TABLE 7

| Power | SAMPLE I | | | SAMPLE II | | | SAMPLE III | | | SAMPLE IV | | |
|---|---|---|---|---|---|---|---|---|---|---|---|---|
| | \multicolumn{12}{c}{Surface resistance [MΩ]} | | | | | | | | | | | |
| [mW] | 1 m/s | 2 m/s | 4 m/s | 1 m/s | 2 m/s | 4 m/s | 1 m/s | 2 m/s | 4 m/s | 1 m/s | 2 m/s | 4 m/s |
| non-printed | 2.5 | 2.5 | 2.5 | 3.3 | 3.3 | 3.3 | 3.3 | 3.3 | 3.3 | 3.3 | 3.3 | 3.3 |
| 30 | 2.5 | 2.3 | 2.5 | 0.06 | 3.0 | 3.0 | 0.005 | 0.12 | 0.6 | 0.025 | 0.13 | 3.5 |
| 47 | 2.3 | 2.0 | 2.5 | 0.05 | 0.5 | 4.0 | 0.0035 | 0.01 | 0.012 | 0.003 | 0.009 | 0.7 |
| 64 | 1.3 | 2.0 | 2.5 | 0.05 | 0.05 | 3.5 | 0.007 | 0.015 | 0.008 | 0.01 | 0.0045 | 0.04 |
| 81 | 0.26 | 1.9 | 2.5 | 0.1 | 0.03 | 1.3 | 0.04 | 0.015 | 0.015 | 0.07 | 0.005 | 0.01 |
| 99 | 0.093 | 1.5 | 2.5 | 0.2 | 0.08 | 0.3 | 0.15 | 0.03 | 0.017 | 0.3 | 0.01 | 0.007 |
| max. $R_s$-ratio* | 26.9 | 1.7 | — | 66 | 110 | 11 | 943 | 330 | 413 | 1100 | 733 | 471 |

*maximum ratio of resistance of non-exposed material/resistance of exposed material For all the exposed Samples processing by softly rubbing with a tissue under water, with the intention of removing the non-exposed parts of the outermost layer, had an influence on resistance measurements carried out with a Fluke™ multimeter with two point electrodes 1 cm apart on exposed and non-exposed areas. Scan lines ca. 10 μm wide were distinguishable. The results are given in Table 8.

and optionally polyacrylic acid, poly(vinyl alcohol) and IR01 (an infra-red absorber capable of converting absorbed infrared-light into heat). Samples V to XI were produced by coating 40 mL/m² of the dispersions given in Table 9 on support nr. 01 to a wet thickness of 40 μm. After drying Samples V to XI had the compositions also given in Table 9.

TABLE 8

| Power | SAMPLE I | | SAMPLE II | | | SAMPLE III | | | SAMPLE IV | | |
|---|---|---|---|---|---|---|---|---|---|---|---|
| | \multicolumn{11}{c}{Surface resistance [MΩ]} | | | | | | | | | | |
| [mW] | 1 m/s | 2 m/s | 1 m/s | 2 m/s | 4 m/s | 1 m/s | 2 m/s | 4 m/s | 1 m/s | 2 m/s | 4 m/s |
| non-printed | 50000 | 50000 | 50000 | 50000 | 50000 | 20000 | 20000 | 20000 | 33000 | 33000 | 33000 |
| 30 | 100000 | 100000 | 0.18 | 33 | 20000 | 0.015 | 0.6 | 50000 | 0.095 | 6.0 | 50000 |
| 47 | 50 | 100000 | 0.05 | 0.9 | 7000 | 0.006 | 0.012 | 100 | 0.006 | 0.035 | 16000 |
| 64 | 1.4 | 100000 | 0.05 | 0.09 | 300 | 0.01 | 0.008 | 0.06 | 0.008 | 0.01 | 100 |
| 81 | 0.6 | 7.0 | 0.1 | 0.05 | 1.8 | 0.015 | 0.015 | 0.012 | 0.05 | 0.01 | 0.34 |
| 99 | 0.25 | 3.3 | 0.25 | 0.07 | 0.35 | 0.05 | 0.017 | 0.015 | 0.1 | 0.014 | 0.02 |
| max. $R_s$-ratio* | $2 \times 10^6$ | $1.5 \times 10^4$ | $1 \times 10^6$ | $1 \times 10^6$ | $1.4 \times 10^5$ | $3.3 \times 10^6$ | $2.5 \times 10^6$ | $1.7 \times 10^6$ | $5.5 \times 10^6$ | $3.3 \times 10^6$ | $1.65 \times 10^6$ |

*maximum ratio of resistance of non-exposed material/resistance of exposed material In all cases the resistance ratio increased upon soft rubbing. A minimum resistance of 6000 Ω was attained at a scanning speed of 1 m/s for Sample III and IV at resistance ratios of unexposed to exposed areas of $3.3 \times 10^6$ and $5.5 \times 10^6$ respectively.

Example 2

In the material for making a conductive pattern of Samples V to XI, the heat-differentiable element consisted of PEDOT/PSS, LATEX01 (a polystyrene latex) and FT 248

TABLE 9

| | \multicolumn{7}{c}{composition of the coating dispersions} | | | | | | |
|---|---|---|---|---|---|---|---|
| | \multicolumn{7}{c}{SAMPLE} | | | | | | |
| INGREDIENT [g] | V | VI | VII | VIII | IX | X | XI |
| Support nr. | 01 | 01 | 01 | 01 | 01 | 01 | 01 |
| 1.2% aq. PEDOT/PSS disp. | 417 | 417 | 417 | 417 | 417 | 417 | 417 |

TABLE 9-continued composition of the coating dispersions

| | SAMPLE | | | | | | |
|---|---|---|---|---|---|---|---|
| | V | VI | VII | VIII | IX | X | XI |
| LATEX01 | 60 | 60 | 60 | 15 | 60 | 30 | 15 |
| 1.5% aqueous PAA solution | — | 100 | — | — | — | — | — |
| 1% aqueous IR01 solution | 200 | 200 | 200 | 200 | — | — | — |
| 5% aqueous PVA solution | — | — | 50 | — | — | — | — |
| 50 g/L FT 248 | 5 | 5 | 5 | 5 | 5 | 5 | 5 |
| deionized water | 318 | 218 | 268 | 363 | 518 | 548 | 563 |
| INGREDIENT [mg/m$^2$] | | | | | | | |
| PEDOT/PSS | 200 | 200 | 200 | 200 | 200 | 200 | 200 |
| LATEX01 | 500 | 500 | 500 | 125 | 500 | 250 | 125 |
| PAA | — | 60 | — | — | — | — | — |
| PVA | — | — | 100 | — | — | — | — |
| IR01 | 80 | 80 | 80 | 80 | — | — | — |
| FT 248 | 10 | 10 | 10 | 10 | 10 | 10 | 10 |
| LATEX01/PEDOT weight ratio | 8.66 | 8.66 | 8.66 | 2.17 | 8.66 | 4.33 | 2.17 |

The materials of SAMPLE V to XI were then image-wise exposed in heat-mode with a diode laser (830 nm) with a spot size of 11 μm, a pitch of 6 μm, at scan speeds of 1 m/s and 4 m/s and an image plane power of up to 150 mW. Both lines and areas were exposed. Resistance measurements were then carried out with a Fluke™ multimeter with two point electrodes 1 cm apart on exposed and non-exposed areas. The results are given in Table 10 for different laser powers and a scanning speed of 1 m/s.

The presence of IR01 significantly increased the sensitivity of the materials as did a reduction in the quantity of LATEX01 with respect to PEDOT/PSS. Maximum resistance ratios between exposed and non-exposed parts of the materials of up to 857 were observed.

Increasing the scanning speed from 1 m/s to 4 m/s gave the results in Table 11. The faster scanning speeds reduced the exposure at a particular power. Similar power-resistance characteristics were observed with the minimum resistance

TABLE 10

| | Surface resistance [MΩ] | | | | | | |
|---|---|---|---|---|---|---|---|
| Power [mW] | V | VI | VII | VIII | IX | X | XI |
| non-printed | 1.0 | 3.0 | 3.0 | 0.8 | 0.5 | 0.47 | 0.5 |
| 30 | 0.003 | 0.0035 | 0.005 | 0.0038 | 0.37 | 0.28 | 0.1 |
| 47 | 0.025 | 0.005 | 0.01 | 0.012 | 0.032 | 0.0084 | 0.0028 |
| 64 | 0.05 | 0.015 | 0.019 | 0.035 | 0.0047 | 0.0022 | 0.016 |
| 81 | 1.0 | 0.1 | 0.05 | 0.5 | 0.0031 | 0.018 | 2500 |
| max. R$_s$-ratio* | 333 | 857 | 600 | 211 | 161 | 214 | 179 |

*maximum ratio of resistance of non-exposed material/resistance of exposed material For all Samples the resistance decreased with increasing power until a minimum resistance was attained which was similar for all the materials of Samples V to XI. For higher powers the resistance increased, the layer at sufficiently high powers becoming brown-coloured and at still higher powers ablating.

at much higher powers. The actual minimum resistances were apparently lower, but this could be due to the energy interval being lower between each power used due to the lower exposure time. The best resistance ratio of unexposed to exposed areas of the outermost layer at a scanning speed of 4 m/s was about 1100 under the heat mode conditions used.

TABLE 11

| Power | Surface resistance [MΩ] | | | | | | |
|---|---|---|---|---|---|---|---|
| [mW] | V | VI | VII | VIII | IX | X | XI |
| non-printed | 1.1 | 2.5 | 3.5 | 0.8 | 0.5 | 0.47 | 0.5 |
| 30 | — | — | — | — | 0.5 | 0.46 | 0.6 |
| 47 | — | — | — | — | 0.5 | 0.43 | 0.5 |
| 64 | — | — | — | — | 0.5 | 0.47 | 0.45 |
| 81 | 0.0043 | 0.0028 | 0.008 | 0.0026 | 0.5 | 0.36 | 0.13 |
| 99 | 0.01 | 0.0022 | 0.008 | 0.0042 | 0.34 | 0.13 | 0.021 |
| 116 | 0.014 | 0.0029 | 0.008 | 0.0055 | 0.15 | 0.064 | 0.007 |

TABLE 11-continued

| Power | Surface resistance [MΩ] | | | | | | |
|---|---|---|---|---|---|---|---|
| [mW] | V | VI | VII | VIII | IX | X | XI |
| 133 | 0.011 | 0.011 | 0.006 | 0.012 | 0.065 | 0.012 | 0.0034 |
| 150 | 0.012 | 0.014 | 0.006 | 0.017 | 0.045 | 0.008 | 0.0026 |
| max. $R_s$-ratio* | 256 | 1136 | 583 | 308 | 11 | 59 | 192 |

*maximum ratio of resistance of non-exposed material/resistance of exposed material For all Samples exposed at a scanning rate of 1 m/s processing the exposed Samples by softly rubbing with a tissue under water, with the intention of removing the non-exposed parts of the outermost layer, had an influence on resistance measurements carried out with a Fluke™ multimeter with two point electrodes 1 cm apart on exposed and non-exposed areas. Scan lines ca. 10 μm wide were distinguishable. The results are given in Table 12.

TABLE 12

| Power | Resistance [MΩ] | | | | | | |
|---|---|---|---|---|---|---|---|
| [mW] | V | VI | VII | VIII | IX | X | XI |
| non-printed | 10000 | 5000 | 5000 | 10000 | 20000 | 33000 | 33000 |
| 30 | 0.04 | 0.009 | 0.013 | 0.02 | 3300 | 330 | 800 |
| 47 | 0.07 | 0.011 | 0.05 | 0.055 | 0.19 | 0.03 | 600 |
| 64 | 0.5 | 0.11 | 0.23 | 0.16 | 0.015 | 0.005 | 0.4 |
| 81 | 0.7 | 0.3 | 0.5 | 1.5 | 0.015 | 0.08 | 20000 |
| 99 | 1000 | 0.5 | 0.22 | 4000 | 0.15 | 130 | 20000 |
| 116 | | | | | 0.7 | 10000 | 100000 |
| 133 | | | | | 1.5 | | 100000 |
| 150 | | | | | 10 | | 100000 |
| max. $R_s$-ratio* | $2.5 \times 10^5$ | $5.6 \times 10^5$ | $3.8 \times 10^5$ | $5.0 \times 10^5$ | $1.3 \times 10^6$ | $6.6 \times 10^6$ | $8.25 \times 10^4$ |

*maximum ratio of surface resistance of non-exposed material/surface resistance of exposed material For all the samples the non-exposed areas are removed, increasing the resistance in the non-exposed areas. This could be attributed to the added presence of polyacrylic acid (PAA). The resistance ratio of unexposed to exposed areas increased for all samples.

Example 3

In the material for making a conductive pattern of Samples XII to XVIII, the heat-differentiable element consisted of PEDOT/PSS, a polystyrene or poly(methyl methacrylate) (PMMA) latex and FT 248. Samples XII to XVIII were produced by coating 40 mL/m of the dispersions given in Table 13 on support nr. 01 to a wet thickness of 40 μm. After drying Samples XII to XVIII had the compositions also given in Table 13. The figures in brackets are the particle sizes of the latex in nm.

TABLE 13

| | composition of the coating dispersions | | | | | | |
|---|---|---|---|---|---|---|---|
| | SAMPLE | | | | | | |
| INGREDIENT [g] | XII | XIII | XIV | XV | XVI | XVII | XVIII |
| Support nr. | 01 | 01 | 01 | 01 | 01 | 01 | 01 |
| 1.2% aq. PEDOT/PSS disp. | 417 | 417 | 417 | 417 | 417 | 417 | 417 |
| LATEX01 | 60 | — | — | — | — | — | — |
| LATEX02 | — | 60 | — | — | — | — | — |
| LATEX03 | — | — | 60 | — | — | — | — |
| LATEX04 | — | — | — | 63 | — | — | — |
| LATEX05 | — | — | — | — | 62 | — | — |
| LATEX06 | — | — | — | — | — | 61 | — |
| LATEX07 | — | — | — | — | — | — | 61 |
| 50 g/L FT 248 | 5 | 5 | 5 | 5 | 5 | 5 | 5 |
| deionized water | 518 | 518 | 518 | 515 | 516 | 517 | 517 |
| PEDOT/PSS [mg/m²] | 200 | 200 | 200 | 200 | 200 | 200 | 200 |

TABLE 13-continued composition of the coating dispersions

| INGREDIENT [g] | SAMPLE | | | | | | |
|---|---|---|---|---|---|---|---|
| | XII | XIII | XIV | XV | XVI | XVII | XVIII |
| PS latex [mg/m$^2$] | 500( ) | 500(68) | — | — | — | — | — |
| PMMA latex [mg/m$^2$] | — | — | 500(68) | 500(54) | 500(52) | 500(49) | 500(64) |
| FT 248 [mg/m$^2$] | 10 | 10 | 10 | 10 | 10 | 10 | 10 |
| LATEX/PEDOT (weight ratio) | 8.66 | 8.66 | 8.66 | 8.66 | 8.66 | 8.66 | 8.66 |

The materials of SAMPLE XII to XVIII were image-wise exposed in heat-mode with a diode laser (830 nm) with a spot size of 11 μm, a pitch of 6 μm, at a scan speed of 1 m/s and an image plane power of up to 150 mW. Both lines and areas were exposed. Resistance measurements were carried out with a Fluke™ multimeter with two point electrodes 1 cm apart on exposed and non-exposed areas. The results are given in Table 14 for different laser powers.

with Samples with PMMA-latexes than those with PS-latexes. Maximum resistance ratios between exposed and non-exposed parts of the materials of up to 600 were observed. Sample XIV with 68 nm PMMA latex particles was significantly less sensitive than the other Samples.

The ratio of resistance of exposed to unexposed parts of the material could be increased by processing the exposed

TABLE 14

| | Resistance [MΩ] | | | | | | |
|---|---|---|---|---|---|---|---|
| Power [mW] | XII PS/ | XIII PS/68 nm | XIV PMMA/68 nm | XV PMMA/54 nm | XVI PMMA/52 mm | XVII PMMA/49 nm | XVIII PMMA/64 nm |
| non-printed | 1.4 | 1.5 | 1.2 | 1.4 | 1.3 | 1.2 | 1.0 |
| 30 | 1.2 | 0.9 | 1.2 | 1.0 | 0.90 | 0.95 | 0.68 |
| 47 | 0.055 | 0.052 | 1.2 | 0.052 | 0.046 | 0.054 | 0.035 |
| 64 | 0.014 | 0.009 | 0.27 | 0.010 | 0.009 | 0.0087 | 0.0075 |
| 81 | 0.007 | 0.005 | 0.023 | 0.0031 | 0.003 | 0.0032 | 0.0025 |
| 99 | 0.02 | 0.015 | 0.0049 | 0.0023 | 0.0025 | 0.0023 | 0.003 |
| 116 | 0.2 | 0.18 | 0.0023 | 0.015 | 0.012 | 0.0072 | 0.012 |
| 133 | 0.2 | 0.2 | 0.0022 | 0.075 | 0.1 | 0.032 | 0.052 |
| max. R$_s$-ratio* | 200 | 300 | 545 | 609 | 520 | 521 | 333 |

*maximum ratio of surface resistance of non-exposed material/surface resistance of exposed material For all Samples the resistance decreased with increasing power until a minimum resistance was attained. At higher powers the resistance increased, the layer at sufficiently high powers becoming brown-coloured and at still higher powers ablating. The Samples with PMMA-latexes exhibited lower minimum resistances than those with PS-latexes, although these minimum resistances were observed at higher powers Samples by softly rubbing with a tissue under water, the non-exposed parts of the outermost layer being thereby removed. Scan lines ca. 10 μm wide were distinguishable. Resistance measurements were then carried out with a Fluke™ multimeter with two point electrodes 1 cm apart on exposed and non-exposed areas. The results are given in Table 15 for different laser powers.

TABLE 15

| | Resistance [MΩ] | | | | | | |
|---|---|---|---|---|---|---|---|
| Power [mW] | XII PS/ | XIII PS/68 nm | XIV PMMA/68 nm | XV PMMA/54 nm | XVI PMMA/52 nm | XVII PMMA/49 nm | XVIII PMMA/64 nm |
| non-printed | >40 | >40 | >40 | >40 | >40 | >40 | >40 |
| 30 | >40 | >40 | >40 | >40 | >40 | >40 | >40 |
| 47 | 0.12 | 0.12 | >40 | 0.15 | 0.12 | 0.13 | >40 |
| 64 | 0.018 | 0.02 | >40 | 0.024 | 0.023 | 0.018 | 0.021 |
| 81 | 0.008 | 0.01 | >40 | 0.0076 | 0.012 | 0.0075 | 0.0064 |
| 99 | 0.048 | 0.1 | 0.01 | 0.0069 | 0.0073 | 0.0058 | 0.005 |
| 116 | 0.4 | 0.5 | 0.0055 | 0.19 | 0.21 | 0.042 | 0.20 |
| 133 | 0.8 | 1.5 | 0.006 | >40 | >40 | 0.50 | >40 |
| max. R$_s$-ratio* | >5000 | >4000 | >7273 | >5797 | >5479 | >6897 | >8000 |

*maximum ratio of surface resistance of non-exposed material/surface resistance of exposed material Below a power of 47 mW the outermost PEDOT/PSS-containing layer was removable for all the Samples. For all Samples from a power of 47 mW the resistance decreased with increasing power until a minimum resistance was attained. At higher powers the resistance increased, the layer at sufficiently high powers becoming brown-coloured and at still higher powers ablating. The Samples with PMMA-latexes again exhibited lower minimum resistances than those with PS-latexes, although these minimum resistances were observed at higher powers with Samples with PMMA-latexes than those with PS-latexes. Maximum resistance ratios between exposed and non-exposed parts of the materials of up to >8000 were observed.

Example 4

In the material for making a conductive pattern of Samples XIX, the heat-differentiable element consisted of two layers on support nr. 01 and was produced by coating the support first with a dispersion consisting of a poly(methyl methacrylate) (PMMA) latex, the infrared dye IR04 and the surfactant FT 248 with the composition given in Table 16 and then coating the resulting layer with a dispersion consisting of a 1.2% by weight aqueous dispersion and a 2% by weight aqueous solution of ZONYL™ FSO100 diluted with deionized water with the composition given in Table 16.

TABLE 16 composition of the coating dispersions

| INGREDIENT [g] | SAMPLE XIX |
|---|---|
| Support nr. | 01 |
| 1st DISPERSION | |
| LATEX 05 | 2.48 |
| 1% aqueous solution of IR04 | 8.00 |
| 5% aqueous solution of FT 248 | 0.50 |
| deionized water | 39.02 |
| 2nd DISPERSION | |
| 1.2% aqueous PEDOT/PSS dispersion | 16.70 |
| 2% aqueous solution of ZONYL ® FSO100 | 0.50 |
| deionized water | 32.8 |

The thicknesses and compositions of the resulting layers together with the surface resistance of the two layer configuration determined as described for EXAMPLE 1 are given in Table 17.

TABLE 17

| INGREDIENT | SAMPLE XIX |
|---|---|
| Support nr. | 01 |
| 1st LAYER | |
| LATEX 05 (solids) [mg/m$^2$] | 503 |
| IR04 [mg/m$^2$] | 80 |
| FT 248 [mg/m$^2$] | 25 |
| 2nd LAYER | |
| PEDOT/PSS [mg/m$^2$] | 200 |
| ZONYL ® FSO100 [mg/m$^2$] | 10 |
| surface resistance of 2 layer configuration [Ω/square] | 7.5 × 10$^6$ |
| overall LATEX05/PEDOT (weight ratio) | 8.71 |

Due to the broad IR-absorption peak of IR04, a coverage of 80 mg/m$^2$ resulted in an absorption of 45% at 1064 nm, the $\lambda_{max}$, and an absorption of 36% at 830 nm.

Thermographic Printing

SAMPLE XIX was thermographically printed with an external drum printer in which the material was mounted on a drum (200 mm in diameter and 650 mm long) and exposed either to a 830 nm diode laser beam, 10.5 μm in diameter, with a pitch of 6 μm or a diode laser-pumped Neodymium YAG 1053 nm laser beam, 18 μm in diameter, with a pitch of 10 μm, which were both on-off modulated by an opto-acoustic modulator. SAMPLE XIX was scanned in a direction perpendicular to the drum rotation direction and parallel to the axis of the drum at a scan speed of 4 m/s or 1m/s with different beam energies, obtained by modulating the current of the laser diode itself or the diode laser used for pumping the Nd-YAG laser.

The surface resistances before printing and the surface resistances after printing with the 830 nm diode laser with different energies and scanning speeds of 1 m/s and 4 m/s are given in Table 18. The exposure time per dot and hence the exposure for a particular power increases with decreasing scan speed.

TABLE 18

| diode laser power [mW] | Scan speed [m/s] | Surface resistance [Ω/square] | Surface resistance after rinsing with deionized water [Ω/square] |
|---|---|---|---|
| non-printed | — | 7.5 × 10$^6$ | >4.0 × 10$^7$ |
| 30 | 4 | 8.5 × 10$^6$ | >4.0 × 10$^7$ |
| 47 | 4 | 7.0 × 10$^6$ | >4.0 × 10$^7$ |
| 64 | 4 | 4.5 × 10$^6$ | 2.5 × 10$^7$ |
| 81 | 4 | 2.5 × 10$^5$ | 5.0 × 10$^5$ |
| 99 | 4 | 8.0 × 10$^5$ | 1.0 × 10$^7$ |
| 116 | 4 | 4.0 × 10$^6$ | 2.7 × 10$^7$ |
| 133 | 4 | 5.0 × 10$^6$ | 3.0 × 10$^7$ |
| 30 | 1 | 1.1 × 10$^5$ | 1.2 × 10$^6$ |
| 47 | 1 | 1.0 × 10$^6$ | 1.3 × 10$^7$ |
| 64 | 1 | >4.0 × 10$^7$ | 3.0 × 10$^7$ |
| 81 | 1 | >4.0 × 10$^7$ | >4.0 × 10$^7$ |

In general below a threshold exposure no differentiation was observed between exposed and unexposed areas subsequent to rinsing with water, i.e. below a power of 64 mW at a scan speed of 4 m/s. Above a particular exposure the conductive layer started to degrade due to the heat generated i.e. carbonization, and ablation begin to occur i.e. above 64 mW at a scan speed of 1 M/s. However, at intermediate exposure energies a decrease in resistance was observed due to the coagulation of the latex particles. A differentiation between exposed and non-exposed areas subsequent to rinsing with deionized water was observed due to an adhesion of the PEDOT/PSS layer to the latex layer which is resistant to rinsing with water in the exposed areas and removal of the PEDOT/PSS layer from the unexposed areas. An optimum differentiation between exposed and unexposed areas subsequent to rinsing with water was observed with the 830 nm laser diode at a power of 81 mW at a scan speed of 4 m/s and at a power of 30 mW at a scan speed of 1 m/s.

The surface resistances before printing and the surface resistances after printing with the 1064 nm Nd-YAG laser with different energies and scanning speeds of 1 m/s and 4 m/s are given in Table 19.

Table 19

| diode laser power [mw] | Scan speed [m/s] | Surface resistance [Ω/square] | Surface resistance after rinsing with deionized water [Ω/square] |
|---|---|---|---|
| non-printed | — | 7.0 × 10$^6$ | >4.0 × 10$^7$ |
| 100 | 4 | 7.0 × 10$^6$ | >4.0 × 10$^7$ |
| 150 | 4 | 2.0 × 10$^6$ | >4.0 × 10$^7$ |

Table 19-continued

| diode laser power [mw] | Scan speed [m/s] | Surface resistance [Ω/square] | Surface resistance after rinsing with deionized water [Ω/square] |
|---|---|---|---|
| 200 | 4 | $3.0 \times 10^5$ | $7.0 \times 10^5$ |
| 250 | 4 | $5.0 \times 10^6$ | $6.0 \times 10^5$ |
| 300 | 4 | $3.0 \times 10^7$ | $3.0 \times 10^7$ |
| 350 | 4 | $>4.0 \times 10^7$ | $3.0 \times 10^7$ |
| 400 | 4 | $>4.0 \times 10^7$ | $3.0 \times 10^7$ |
| 450 | 4 | $>4.0 \times 10^7$ | $3.0 \times 10^7$ |
| 100 | 1 | $7.5 \times 10^4$ | $1.5 \times 10^5$ |
| 150 | 1 | $>4.0 \times 10^7$ | $>4.0 \times 10^7$ |

The exposure time per dot and hence the exposure for a particular power increases with decreasing scan speed. In general below a threshold exposure no differentiation was observed between exposed and unexposed areas subsequent to rinsing with water, i.e. below a power of 200 mW at a scan speed of 4 m/s, and above a particular exposure again no differentiation was observed between exposed and unexposed areas subsequent to rinsing with water due to delamination of the latex layer, i.e. from a power of 150 mW at a scan speed of 1m/s. However, at intermediate exposure energies differentiation was observed due to an adhesion of the PEDOT/PSS layer to the latex layer which is resistant to rinsing with water in the exposed areas and removal of the PEDOT/PSS layer by rinsing with water from the unexposed areas. An optimum differentiation between exposed and unexposed areas subsequent to rinsing with water was observed with the 1064 nm Nd-YAG laser at a power of 250 mW at a scan speed of 4 m/s and at a power of 100 mW at a scan speed of 1 m/s.

These results show that imagewise heating of a two layer configuration with a PEDOT/PSS layer above a latex layer produces a conductive pattern before and after removal of less exposed areas, according to the present invention.

Example 5 (Comparative)

Support 02 was coated with an aqueous ammoniacal N-methyl-pyrrolidinone dispersion containing the following ingredients to produce the following ingredient coverages:

| | | Coverage |
|---|---|---|
| Kelzan ™ S: | | 10 mg/m² |
| PEDOT/PSS-1: | (PEDT/PSS = 1:2.46 by weight) | 15 mg/m² |
| UVONAC: | | 21 mg/m² |
| Kieselsol 100F: | | 20 mg/m² |
| PE40 | (a polyethylene latex) | 10 mg/m² |
| LATEX02: | (a poly(methyl methacrylate) latex with 100 nm particles) | 200 mg/m² |
| MAT01: | (a 6 µm crosslinked beads of a copolymer of 98% methyl methacrylate and 2% stearyl methacrylate) | 30 mg/m² |
| N-methylpyrrolidone | | 0.76 mL/m² largely evaporated |

The resulting material, SAMPLE XX, has two layers representing a two layer element containing N-methylpyrrolidone with an overall eight ratio of hydrophobic latex to PEDOT of 92.8:1 being outside the present invention due to a latex/PEDOT weight ratio greater than 20:1 and its containing N-methylpyrrolidone, an aprotic compound with a dielectric constant, $\in$, $\geq 15$.

Exposure with a Laser Diode (830 nm)

SAMPLE XX was then image-wise exposed in heat-mode as described for SAMPLES I to IV and the image plane power is given in Table 20. Resistance measurements were carried out with a Fluke™ multimeter with two point electrodes 1 cm apart on exposed and non-exposed areas. The results are given in Table 20 for different laser powers and all scanning speeds.

TABLE 20

| | Surface resistance [MΩ] SAMPLE XX | |
|---|---|---|
| Power [mW] | 1 m/s | 4 m/s |
| non-printed | 14 | 14 |
| 30 | 14 | 14 |
| 47 | 14 | 14 |
| 64 | 14 | 14 |
| 81 | 14 | 14 |
| 99 | 14 | 14 |
| 116 | 11 | 14 |
| 133 | 12 | 14 |
| 150 | 12 | 14 |
| max. $R_s$-ratio* | 1.27 | 1.0 |

*maximum ratio of resistance of non-exposed material/resistance of exposed material Exposure with a Nd-YAG Laser (1064 nm)

SAMPLE XX was then image-wise exposed in heat-mode as described for SAMPLES I to IV and the image plane power is given in Table 21. Resistance measurements were carried out with a Fluke™ multimeter with two point electrodes 1 cm apart on exposed and non-exposed areas. The results are given in Table 21 for different laser powers and all scanning speeds.

TABLE 21

| | Surface resistance [MΩ] SAMPLE XX | |
|---|---|---|
| Power [mW] | 1 m/s | 4 m/s |
| non-printed | 14 | 14 |
| 100 | 14 | 14 |
| 150 | 14 | 14 |
| 200 | 14 | 14 |
| 250 | 14 | 14 |
| 300 | 14 | 14 |
| 350 | 7.1 | 14 |
| 400 | 11 | 14 |
| 450 | 11 | 14 |
| max. $R_s$-ratio* | 1.97 | 1.0 |

*maximum ratio of resistance of non-exposed material/resistance of exposed material The results in Tables 20 and 21 show that image-wise exposure in heat mode gave very slight differentation in surface resistance for writing at 1 m/s at very high powers and no differentiation in surface resistance for writing at 4 m/s even at very high powers. This shows that for a weight ratio of latex to PEDOT of 92.8 virtually no effect was observed.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

We claim:

1. A material for making a conductive pattern, said material comprising a support and a heat-differentiable element, said heat-differentiable element comprising an outermost layer containing a polyanion and an intrinsically conductive polymer and optionally a second layer contiguous with said outermost layer, characterized in that said outermost layer and/or said optional second layer contains hydrophobic thermocoagulable latex particles in a weight ratio range with respect to said intrinsically conductive polymer in the range of 20:1 to 1:5, said hydrophobic thermocoagulable latex particles are capable upon heating of increasing the conductivity of the heated parts of said outermost layer relative to the unheated parts of said outermost layer and/or changing the removability of the heated parts of said outermost layer relative to the unheated parts of said outermost layer and said heat-differentiable element does not comprise a di- or polyhydroxy organic compound or an aprotic compound with a dielectric constant, $\in$, $\geq 15$.

2. Material according to claim 1, wherein said conductive pattern is an electroconductive pattern.

3. Material according to claim 1, wherein the heat-differentiable element contains a weight ratio of hydrophobic thermocoagulable latex particles to the intrinsically conductive polymer in the range of 9:1 to 1:3.

4. Material according to claim 1, wherein said intrinsically conductive polymer is a polymer or copolymer of a substituted or unsubstituted thiophene.

5. Material according to claim 4, wherein said polymer of a substituted or unsubstituted thiophene corresponds to formula (II):

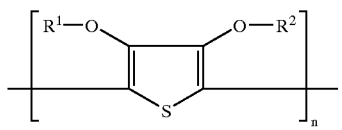

in which n is larger than 1 and each of $R^1$ and $R^2$ independently represent hydrogen or an optionally substituted $C_{1-4}$ alkyl group or together represent an optionally substituted $C_{1-5}$-alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

6. Material according to claim 1, wherein said polyanion is poly(styrenesulphonate).

7. Material according to claim 1, wherein said heat-differentiable element further contains a compound capable of converting absorbed light into heat.

8. A method of making a conductive pattern on a support comprising the steps of:

providing a material for making a conductive pattern, said material comprising a support and a heat-differentiable element, said heat-differentiable element comprising an outermost layer containing a polyanion and an intrinsically conductive polymer and optionally a second layer contiguous with said outermost layer, characterized in that said outermost layer and/or said optional second layer contains hydrophobic thermocoagulable latex particles which are capable upon heating of increasing the conductivity of the heated parts of said outermost layer relative to the unheated parts of said outermost layer and/or changing the removability of the heated parts of said outermost layer relative to the unheated parts of said outermost layer and said heat-differentiable element does not comprise a di- or polyhydroxy organic compound;

image-wise heating said material thereby obtaining a differentiation of the surface conductivity and/or removability with a developer of said heated and said unheated areas of said outermost layer;

optionally processing said material with said developer, thereby at least partially removing areas of said outermost layer optionally together with a layer contiguous therewith; and optionally treating said material with a conductivity enhancement agent to increase the conductivity of said non-removed areas of said outermost layer.

9. Method according to claim 8, wherein said image-wise heating is carried out with a thermal head or a laser.

10. Method according to claim 8, wherein the laser is an infrared laser.

11. Method according to claim 8, wherein said conductive pattern has a surface resistance lower than $10^6$ $\Omega$/square.

12. A process for using a material for making a conductive pattern, said material comprising a support and a heat-differentiable element, said heat-differentiable element comprising an outermost layer containing a polyanion and an intrinsically conductive polymer and optionally a second layer contiguous with said outermost layer, characterized in that said outermost layer and/or said optional second layer contains hydrophobic thermocoagulable latex particles which are capable upon heating of increasing the conductivity of the heated parts of said outermost layer relative to the unheated parts of said outermost layer and/or changing the removability of the heated parts of said outermost layer relative to the unheated parts of said outermost layer and said heat-differentiable element does not comprise a di- or polyhydroxy organic compound, in making an electronic circuit in the production of an electric or semiconductor device such as a printed circuit board, an integrated circuit, a display or touch screen, an electroluminescent device or a photovoltaic cell.

13. A process for using a method of making a conductive pattern on a support comprising the steps of:

providing a material for making a conductive pattern, said material comprising a support and a heat-differentiable element, said heat-differentiable element comprising an outermost layer containing a polyanion and an intrinsically conductive polymer and optionally a second layer contiguous with said outermost layer, characterized in that said outermost layer and/or said optional second layer contains hydrophobic thermocoagulable latex particles which are capable upon heating of increasing the conductivity of the heated parts of said outermost layer relative to the unheated parts of said outermost layer and/or changing the removability of the heated parts of said outermost layer relative to the unheated parts of said outermost layer and said heat-differentiable element does not comprise a di- or polyhydroxy organic compound;

image-wise heating said material thereby obtaining a differentiation of the surface conductivity and/or removability with a developer of said heated and said unheated areas of said outermost layer;

optionally processing said material with said developer, thereby at least partially removing areas of said outermost layer optionally together with a layer contiguous therewith; and optionally treating said material with a conductivity enhancement agent to increase the conductivity of said non-removed areas of said outermost layer, in making an electronic circuit in the production of an electric or semiconductor device such as a printed circuit board, an integrated circuit, a display or touch screen, an electroluminescent device or a photovoltaic cell.

* * * * *